United States Patent [19]
McClure et al.

[11] Patent Number: 5,455,799
[45] Date of Patent: Oct. 3, 1995

[54] CIRCUIT WHICH PROVIDES POWER ON RESET DISABLE DURING A TEST MODE

[75] Inventors: David C. McClure, Carrollton; Thomas A. Teel, Austin, both of Tex.

[73] Assignee: SGS-THOMSON Microelectronics, Inc., Carrollton, Tex.

[21] Appl. No.: 267,666

[22] Filed: Jun. 29, 1994

[51] Int. Cl.$^6$ .................................................. G11C 7/00
[52] U.S. Cl. .................................... 365/201; 365/226
[58] Field of Search ................................ 365/226, 227, 365/201, 200, 195; 307/272.3

[56] References Cited

U.S. PATENT DOCUMENTS 5,345,424   9/1994   Landgraf ............................... 365/227
5,349,586   9/1994   Katsuta ................................. 365/227

Primary Examiner—David C. Nelms
Assistant Examiner—A. Zarabian
Attorney, Agent, or Firm—Renee M. Larson; Lisa K. Jorgenson; Richard K. Robinson

[57] ABSTRACT

According to the present invention, a special operating mode of an integrated circuit device, such as a stress test mode, is entered while the integrated circuit device is powered up in order to avoid the large switching transients from multiple rows and columns being enabled simultaneously which would result if the stress test mode was entered after the integrated circuit device is powered up. Hence, power on reset can not be avoided by waiting until the power-on reset pulse is generated. The power on reset pulse of the integrated circuit device may be overridden or effectively disabled during a stress test mode, such that potential contention between the power-on reset pulse and the test mode signal of the integrated circuit device is eliminated. As a result, crowbar current is accordingly eliminated so that proper state initialization during a stress test mode may be accomplished.

20 Claims, 2 Drawing Sheets

CIRCUIT WHICH PROVIDES POWER ON RESET DISABLE DURING A TEST MODE

CROSS REFERENCE TO RELATED APPLICATIONS

The subject matter of the present application is related to copending U.S. application, Ser. No. 08/172,854, titled "Stress Test Mode", filed Dec. 22, 1993, which is assigned to the assignee hereof and herein incorporated by reference.

BACKGROUND OF THE INVENTION

The present invention relates generally to integrated circuit devices, and more specifically to integrated circuit devices having power on reset circuitry.

Integrated circuit devices often concurrently utilize power on reset (POR) circuitry which provides proper initialization of circuitry upon power up, and special operating modes, which allow for appropriate stressing or testing of an integrated circuit device. Power on reset, typically a pulse, is generated upon power up of the integrated circuit device, and initializes those circuits of the integrated circuit device which require initialization. Referring to FIG. 1, a power on reset pulse is shown. A typical power on reset pulse is a low pulse which transitions to a high logic state when the supply voltage VCC is approximately 2.5 volts. Above this threshold, the power on reset pulse tracks VCC, as shown in FIG. 1.

In addition to power on reset circuitry, special operating modes are frequently invoked in integrated circuit memory devices in order to achieve greater efficiencies in stress testing. For instance, copending U.S. application Ser. No. 08/172,854, titled "Stress Test Mode", filed Dec. 22, 1993, teaches enabling all rows and columns of an integrated circuit memory device simultaneously. While enabling all rows/columns simultaneously is contrary to normal operation, it provides great efficiency in the stress testing of the integrated circuit memory device.

In spite to the benefits represented by power on reset circuitry and special operating modes, their concurrent use may be hazardous. Often, the concurrent use of a power on reset pulse and a special operating mode, such as a stress test mode, may introduce contention problems where the power on reset pulse adversely affects test mode operation. For instance, the power on reset pulse may be attempting to precharge or force a circuit in a direction opposite to the test mode, creating contention between these two signals. If this contention proceeds unchecked, large crowbar currents may result for the duration of the power on reset pulse, which may last longer than 300 uS. The magnitude of these crowbar currents may vary from approximately 100 mA to more than 1A. In addition, the resultant test condition may be incorrect because of the faulty initialization provided by the power on reset pulse.

Thus, there exists an unmet need in the art to be able to concurrently utilize power on reset circuitry and special operating modes of an integrated circuit device without the introduction of destructive contention which causes large crowbar currents.

SUMMARY OF THE INVENTION

It would be advantageous in the art to be able to concurrently utilize power on reset circuitry and special operating modes of an integrated circuit device.

It would further be advantageous in the art to eliminate contention between the power on reset pulse and the special operating mode of an integrated circuit device, such that destructive crowbar currents are correspondingly eliminated.

It would further be advantageous in the art to eliminate such crowbar currents, such that proper test mode initialization may be achieved during test mode operation of the integrated circuit device.

Therefore, according to the present invention, a special operating mode of an integrated circuit device, such as a stress test mode, is entered while the integrated circuit device is powered up in order to avoid the large switching transients from multiple rows and columns being enabled simultaneously which would result if the stress test mode was entered after the integrated circuit device is powered up. Hence, power on reset can not be avoided by waiting until the power-on reset pulse is generated. The power on reset pulse of the integrated circuit device may be overridden or effectively disabled during a stress test mode, such that potential contention between the power-on reset pulse and the test mode signal of the integrated circuit device is eliminated. As a result, crowbar current is accordingly eliminated so that proper state initialization during a stress test mode may be accomplished.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of an illustrative embodiment when read in conjunction with the accompanying drawings, wherein:

DESCRIPTION OF THE INVENTION

According to the present invention, contention between a power on reset (POR) pulse and a special operating mode of an integrated circuit device is avoided, thereby eliminating the problems associated with large crowbar currents, by ignoring or effectively disabling the power on reset pulse during the special operating mode. As a result, destructive crowbar currents are eliminated and proper state initialization during a stress test mode may be accomplished. The stress test mode must be entered while the device is powered up in order to avoid the large switching transients from multiple rows and columns being enabled simultaneously which would result if the stress test mode was entered after the device is powered up, Hence, power on reset can not be avoided by waiting until the power on reset pulse is generated.

Figure 1:
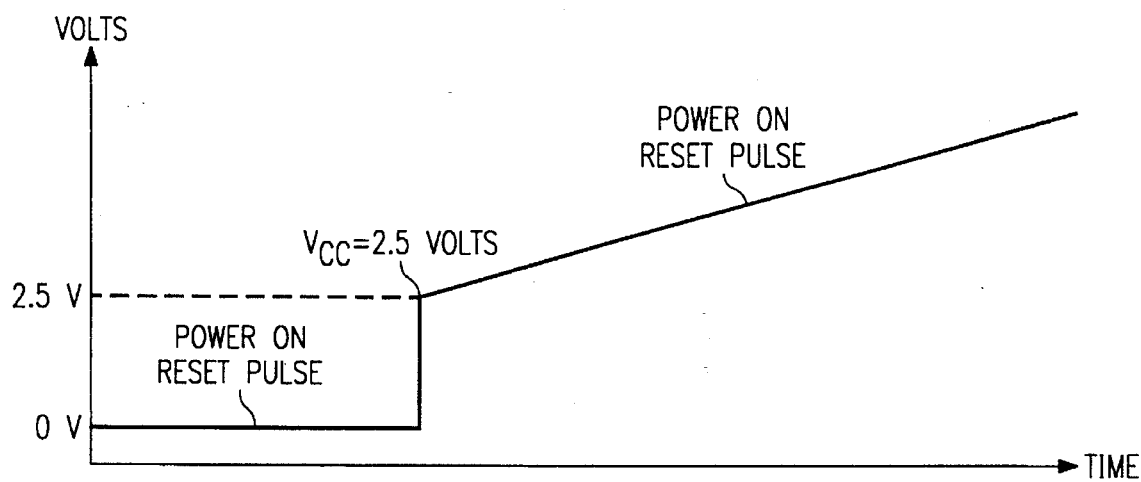
FIG. 1 is a graph showing a power on reset pulse.
Figure 3:
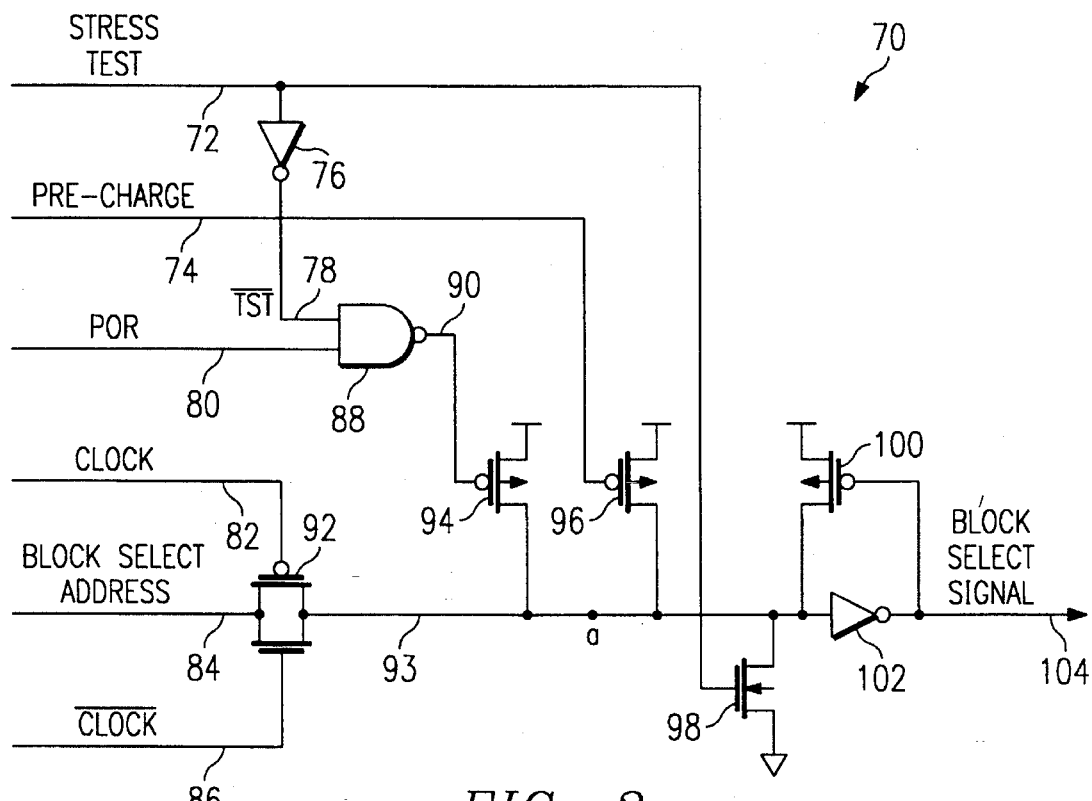
FIG. 3 is a schematic diagram of block select circuitry, according to the present invention.
Figure 2:
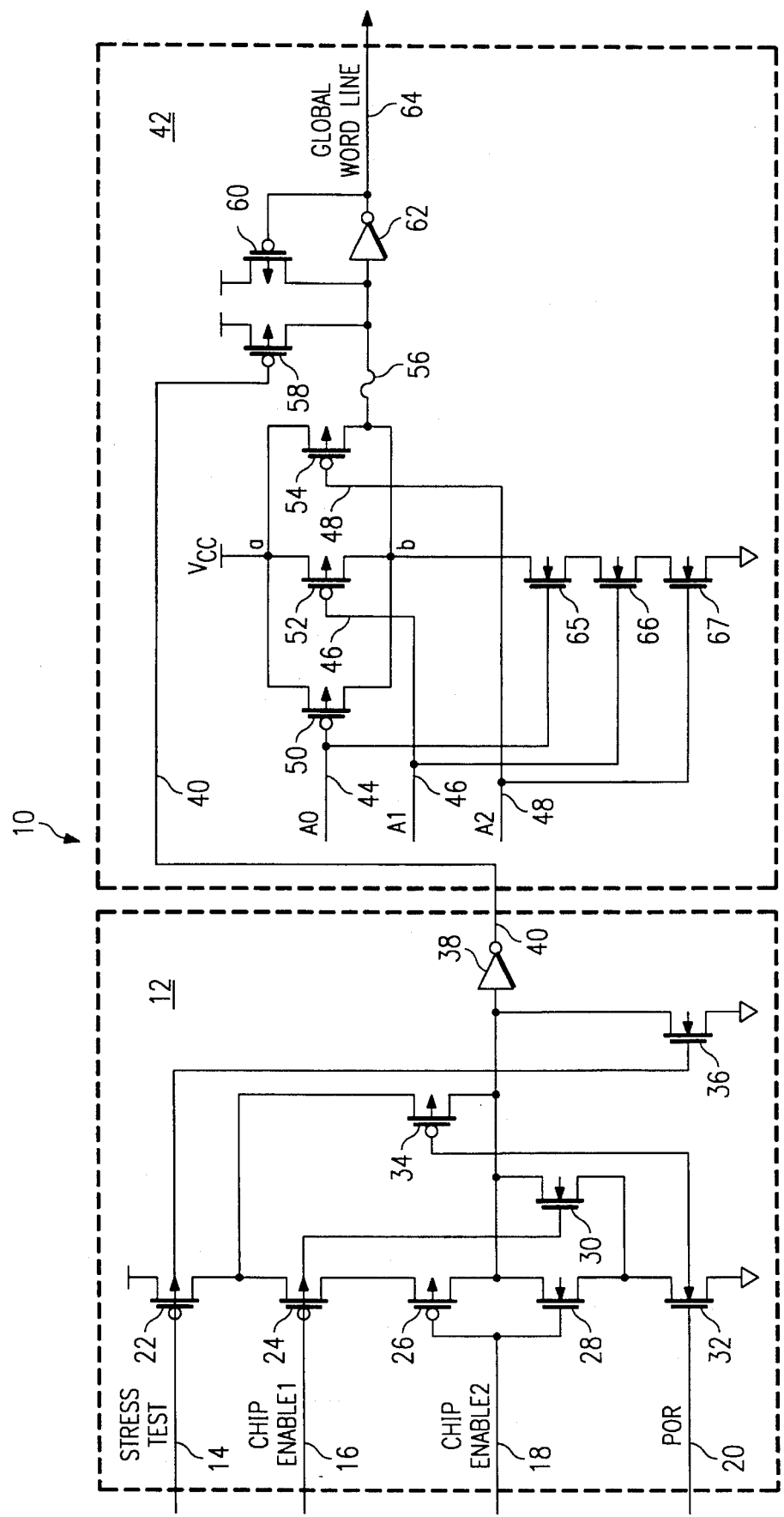
FIG. 2 is a schematic diagram of row control and global word line decoder/driver circuitry, according to the present invention.

Disabling the power on reset pulse of an integrated circuit device in order to eliminate contention between the power on reset pulse and a special operating mode, such as a stress test mode, may be potentially utilized in any integrated circuit device which has power on reset and special operating mode capabilities. FIGS. 2 and 3 illustrate the present invention with regard to integrated circuit memory devices, yet one skilled in the art will recognize that the present invention is not limited to integrated circuit memory devices.

Referring to FIG. 2, a schematic diagram of row control and global word line decoder/driver circuitry 10, according to the present invention, is shown. Circuitry 10 is suitable for use in a 1 Meg static random access memory (SRAM) integrated circuit memory device, and is comprised of row pre-decoder control circuitry 12 and global word line decoder/driver circuitry 42. As used in a 1 Meg SRAM, one placement of row pre-decoder control circuitry 12 corresponds to 128 placements of global word line decoder/driver circuitry 42; therefore, signal 40 which is produced by row pre-decoder control circuitry 12 is bussed to support the 128 placements of global word line decoder/driver circuitry 42.

Row pre-decoder control circuitry 12 is comprised of transistors 22, 24, 26, 28, 30, 32, 34, 36, and inverter 38. The interconnections of these components with respect to incoming signals 14, 16, 18, 20, and each other, will now described. The gate of transistor 22 and the gate of transistor 36 are each supplied with incoming stress test signal 14. A first source/drain of transistor 22 is connected to supply voltage VCC as shown, while a second source/drain of transistor 22 is connected to a first source/drain of transistor 24 and a first source/drain of transistor 34. The gate of transistor 24 is supplied with incoming chip enable1 signal 16, which also supplies the gate of transistor 30 as shown. A second source/drain of transistor 24 is connected to a first source/drain of transistor 26. Incoming chip enable2 signal 18 feeds the gates of transistor 26 and transistor 28. A second source/drain of transistor 26 is connected to a first source/drain of transistor 28, a first source/drain of transistor 30, a second source/drain of transistor 34, a first source/drain of transistor 36, and the input terminal of inverter 38, as shown. The second source/drain of transistor 28 is connected to the second source/drain of transistor 30, as well as the first source/drain of transistor 32. Incoming power on reset (POR) signal 20 is supplied to the gate of transistor 32, as well as the gate of transistor 34. Finally, the second source/drain of transistor 32 and the second source/drain of transistor 36 are each connected to supply voltage VSS, as shown.

According to the present invention, during a stress test mode, power on reset signal 20 is overridden and thus effectively disabled. During a stress test mode, stress test signal 14 goes to a high logic level, thereby unconditionally forcing signal 40 to a high logic level such that POR signal 20 is ignored. As mentioned above, signal 40 drives global word line decoder/driver circuitry 42 and must be bussed to support the number of placements of global word line decoder/driver circuitry 42.

Global word line decoder/driver circuitry 42 is comprised of transistors 44, 46, 48, 58, 60, 65, 66, 67, fuse 56, and inverter 62. These components are interconnected with respect to incoming signals 40, 44, 46, 48, and each other, in the following manner. Derivative address A0 signal 44 is supplied to the gates of transistors 50 and 65; derivative address A1 signal 46 is supplied to the gates of transistors 52 and 66; and derivative address A2 signal 48 is supplied to the gates of transistors 54 and 67, as shown. Derivative address signals 44, 46, and 48 are typically address predecode signals which are derived from multiple address signals. A first source/drain of transistor 50, a first source/drain of transistor 52, and a first source/drain of transistor 54 form node a which is connected to supply voltage VCC; a second source/drain of transistor 50, a second source/drain of transistor 52, a second source/drain of transistor 54, and a first source/drain of transistor 65 form node b which is connected to supply voltage VSS. Node b is connected to a first terminal of fuse 56, as well. A second terminal of fuse 56 is connected to a second source/drain of transistor 58 and a second source/drain of transistor 60 and the input terminal of inverter 62. Signal 40 from circuitry 12 feeds the gate of transistor 58. A second source/drain of transistor 65 is connected to a first source/drain of transistor 66. A second source/drain of transistor 66 is connected to a first source/drain of transistor 67, and a second source/drain of transistor 67 is connected to supply voltage VSS as shown. A first source/drain of transistor 58 and a first source/drain of transistor 60 are each connected to supply voltage VCC as shown. The gate of transistor 60 is connected to the output signal of inverter 62, global word line signal 64.

During a stress test, signal 40 goes to a high logic level and derivative address signals 44, 46, and 48 are also all equal to a high logic level. Signal 40 is used to initialize the state of fuse disconnected global word line 64 during normal power up. Thus, when fuse 56 is blown, signal 40 is connected to the gate of transistor 58 to ensure that global word line 64 is held to the low logic state. If fuse 56 is intact, transistors 65, 66, and 67 would be in conflict with transistor 58. Since this contention would occur in all 128 placements during the stress test mode where derivative address signals A0, A1, A2 are high for all 128 placements, a large current may result.

The circuitry 10 of FIG. 2 accomplishes the objects of the present invention. POR signal 20 is overridden and thus effectively disabled during a stress test mode when stress test signal 14 is a high logic level, such that contention between the POR signal 20 and stress test signal 14 is eliminated. As a result, crowbar currents are eliminated and proper state initialization during a stress test mode may be accomplished. The stress test mode must be entered while the device is powered up in order to avoid the large switching transients that may potentially result from multiple rows and columns being enabled simultaneously if the stress test mode was entered after the device is powered up.

FIG. 3 shows a schematic diagram of block select circuitry 70, according to the present invention. Block select circuitry 70 is suitable for utilization in a synchronous burst SRAM, such as the SGS-Thomson Microelectronics BRAM currently available on the market. Block select circuitry 70 is comprised of inverters 76, 102, NAND gate 88, passgate 92, and transistors 94, 96, 98, and 100. These components are interconnected with respect to incoming signals 72, 74, 80, 82, 84, 86, and each other, in the following manner. Stress test signal 72 is applied to the gate of transistor 98. Inverter 76 inverts stress test signal 72 to yield a complement signal TST bar signal 78 which is a first input signal to NAND gate 88. Power on reset (POR) signal 80 is the second input signal to NAND gate 88. The output signal 90 of NAND gate 88 is fed to the gate of transistor 94. Pre-charge signal 74 ensures that for every cycle, node a is pulled to a high logic level in readiness for the next cycle. Pre-charge signal 74 feeds the gate of transistor 96. Block select address signal 84 is the input signal to passgate 92 which is controlled by clock signal 82 and clock bar signal 86. The output signal 93 of passgate 92 is connected to a second source/drain of transistor 94, a second source/drain of transistor 96, a first source/drain of transistor 98, a second source/drain of transistor 100, and the input terminal of inverter 102. The output signal of inverter 102 is block select signal 104 which is connected to the gate of transistor 100. The first source/drain of transistor 94, the first source/drain of transistor 96, and the first source/drain of transistor 100 are each connected to supply voltage VCC. The second source/drain of transistor 98 is connected to supply voltage VSS.

In keeping with the present invention, POR signal 80 is ignored and thus effectively disabled during a stress test mode. During a stress test mode, TST bar signal 78 is a low logic level and signal 90 is forced to a high logic level such that POR signal 80 is ignored. When stress test signal 72 is a high logic level, block select signal 104 is forced to a high logic level. This allows for all blocks to be selected. Conversely, during normal operation, TST bar signal 78 is a high logic level, and POR signal 80 is not ignored.

FIG. 2 illustrates how the present invention may be utilized to ignore a POR signal during a stress test mode of a SRAM device. Similarly, FIG. 3 illustrates how the present invention may be utilized to ignore a POR signal during a stress test mode of a BRAM device. The circuitries of FIGS. 2 and 3 illustrate two examples of the concept of ignoring a POR signal during a stress test mode so as to eliminate crowbar currents and to allow for correct test mode initialization. As will be understood by those skilled in the art, there may be many such embodiments which also may make use of the present invention. For instance, while FIGS. 2 and 3 are directed to memory circuitries, one skilled in the art will appreciate that the present invention is not limited to integrated circuit memory devices. There are a variety of integrated circuit devices which utilize POR signals and special operating modes which may make use of the present invention.

While the invention has been particularly shown and described with reference to a preferred embodiment, it will be understood by those skilled in the art that various changes in form and detail may be made therein without departing from the spirit and scope of the invention.

What is claimed is:

1. A method for eliminating contention between a special operating mode and a power-on reset signal, comprising the steps of:

entering into a special operating-mode of an integrated circuit device as the integrated circuit device is powering up; and overriding a power on reset signal during the special operating mode of the integrated circuit device such that the power on reset signal does not perform initialization of a portion of the integrated circuit device.

2. The method of claim 1, wherein the power on reset signal is overridden when a test signal, which is an input signal to the integrated circuit device, is equal to a logic state indicative of the special operating mode.

3. The method of claim 1, wherein overriding the power on reset signal during the special operating mode allows for a proper initialization of the special operating mode.

4. The method of claim 1, wherein overriding the power on reset signal during the special operating mode eliminates possible contention between the power on reset signal and the special operating mode.

5. The method of claim 1, wherein the special operating mode is a stress test mode.

6. The method of claim 5, wherein the integrated circuit device is an integrated circuit memory device, and the stress test mode enables all rows and all columns of the integrated circuit memory device simultaneously.

7. The method of claim 1, wherein the integrated circuit device is an integrated circuit memory device.

8. The method of claim 7, wherein the integrated circuit memory device is static random access memory (SRAM) device.

9. The method of claim 8, wherein the integrated circuit memory device is a 1 Meg SRAM.

10. The method of claim 8, wherein the integrated circuit memory device is a synchronous SRAM.

11. An integrated circuit structure for eliminating contention between a special operating mode and a power-on reset signal, comprising:

an integrated circuit device;

a power on reset signal, which is an input signal to the integrated circuit device; and a test signal, which is an input signal to the integrated circuit device; wherein when the test signal is equal to a first logic level indicative of a special operating mode of the integrated circuit device, the power on reset signal is overridden such that a potential contention between the power on reset signal and the test signal is eliminated and the power on reset signal does not perform initialization of a portion of the integrated circuit device.

12. The structure of claim 11, wherein the special operating mode of an integrated circuit device is entered while the integrated circuit device is powered up.

13. The structure of claim 11, wherein overriding the power on reset signal during the special operating mode allows for a proper initialization of the special operating mode.

14. The structure of claim 11, wherein overriding the power on reset signal during the special operating mode eliminates possible contention between the power on reset signal and the special operating mode.

15. The structure of claim 11, wherein the special operating mode is a stress test mode.

16. The structure of claim 15, wherein the integrated circuit device is an integrated circuit memory device, and the stress test mode enables all rows and all columns of the integrated circuit memory device simultaneously.

17. The structure of claim 11, wherein the integrated circuit device is an integrated circuit memory device.

18. The structure of claim 17, wherein the integrated circuit memory device is static random access memory (SRAM) device.

19. The structure of claim 18, wherein the integrated circuit memory device is a 1 Meg SRAM.

20. The structure of claim 18, wherein the integrated circuit memory device is a synchronous SRAM.

* * * * *